United States Patent
Ko et al.

(10) Patent No.: US 8,168,995 B2
(45) Date of Patent: May 1, 2012

(54) NITRIDE BASED SEMICONDUCTOR LIGHT EMITTING DIODE

(75) Inventors: Kun Yoo Ko, Hwaseong (KR); Seok Min Hwang, Suwon (KR); Hyung Jin Park, Suwon (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 603 days.

(21) Appl. No.: 11/543,231

(22) Filed: Oct. 5, 2006

(65) Prior Publication Data

US 2007/0085095 A1 Apr. 19, 2007

(30) Foreign Application Priority Data

Oct. 17, 2005 (KR) .......................... 10-2005-0097604

(51) Int. Cl.
*H01L 33/00* (2010.01)
(52) U.S. Cl. ............ 257/99; 257/E33.062; 257/E33.065
(58) Field of Classification Search .................... 372/99; 257/99, E33.062, E33.065
See application file for complete search history.

(56) References Cited

U.S. PATENT DOCUMENTS

| | | | | |
|---|---|---|---|---|
| 3,427,516 A | * | 2/1969 | Antell | 257/102 |
| 4,589,745 A | * | 5/1986 | Plummer | 396/548 |
| 5,523,591 A | * | 6/1996 | Fleming et al. | 257/91 |
| 6,307,218 B1 | * | 10/2001 | Steigerwald et al. | 257/99 |
| 6,380,564 B1 | * | 4/2002 | Chen et al. | 257/99 |
| 6,559,479 B1 | * | 5/2003 | Ludemann | 257/99 |
| 6,614,056 B1 | * | 9/2003 | Tarsa et al. | 257/91 |
| 6,649,939 B1 | * | 11/2003 | Wirth | 257/95 |
| 6,828,596 B2 | * | 12/2004 | Steigerwald et al. | 257/99 |
| 6,900,472 B2 | * | 5/2005 | Kondoh et al. | 257/94 |
| 6,958,498 B2 | * | 10/2005 | Shelton et al. | 257/99 |
| 7,005,680 B2 | * | 2/2006 | Otsuka et al. | 257/91 |
| 2003/0107053 A1 | * | 6/2003 | Uemura et al. | 257/200 |
| 2004/0012030 A1 | * | 1/2004 | Chen et al. | 257/99 |

(Continued)

FOREIGN PATENT DOCUMENTS

CN 1630106 6/2005

(Continued)

OTHER PUBLICATIONS

Merriam-Webster OnLine Dictionary definition of "adjacent."*

(Continued)

*Primary Examiner* — Hrayr A Sayadian
(74) *Attorney, Agent, or Firm* — McDermott Will & Emery LLP

(57) ABSTRACT

A nitride based semiconductor LED is provided. In the nitride based semiconductor LED, an n-type nitride semiconductor layer is formed on a substrate. The n-type nitride semiconductor layer has the top surface divided into a first region and a second region with a finger structure, so that the first region and the second region are meshed with each other. An active layer is formed on the second region of the n-type nitride semiconductor layer. A p-type nitride semiconductor layer is formed on the active layer, and a reflective electrode is formed on the p-type nitride semiconductor layer. A p-electrode is formed on the reflective electrode, and an n-electrode is formed on the first region of the n-type nitride semiconductor layer. A plurality of n-type electrode pads are formed on the n-electrode. At least one of the n-type electrode pads are arranged adjacent to different sides of the n-electrode.

8 Claims, 4 Drawing Sheets

U.S. PATENT DOCUMENTS

| | | | |
|---|---|---|---|
| 2004/0061123 A1* | 4/2004 | Shelton et al. | 257/99 |
| 2005/0017262 A1* | 1/2005 | Shei et al. | 257/103 |
| 2005/0023549 A1* | 2/2005 | Gardner et al. | 257/99 |
| 2005/0051785 A1* | 3/2005 | Erchak et al. | 257/98 |
| 2005/0052878 A1* | 3/2005 | Yamada et al. | 362/460 |
| 2005/0133807 A1* | 6/2005 | Park et al. | 257/99 |
| 2006/0001035 A1* | 1/2006 | Suehiro et al. | 257/91 |
| 2006/0192223 A1* | 8/2006 | Lee et al. | 257/99 |
| 2007/0085095 A1* | 4/2007 | Ko et al. | 257/94 |
| 2008/0001162 A1* | 1/2008 | Hackenberger et al. | 257/99 |

FOREIGN PATENT DOCUMENTS

| | | |
|---|---|---|
| CN | 1666351 | 9/2005 |
| JP | 2001-345480 | 12/2001 |
| JP | 2004-056109 | 2/2004 |
| JP | 2004-172189 | 6/2004 |
| JP | 2005-019646 | 1/2005 |
| JP | 2005-276900 | 10/2005 |
| KR | 10-0501109 | 7/2005 |

OTHER PUBLICATIONS

English translation of the Abstract of Mori.*

Japanese Office Action issued in Japanese Patent Application No. JP 2006-278607, dated Jun. 21, 2009.

Japanese Office Action, with English Translation, issued in Japanese Patent Application No. 2006-278607, mailed Oct. 26, 2010.

* cited by examiner

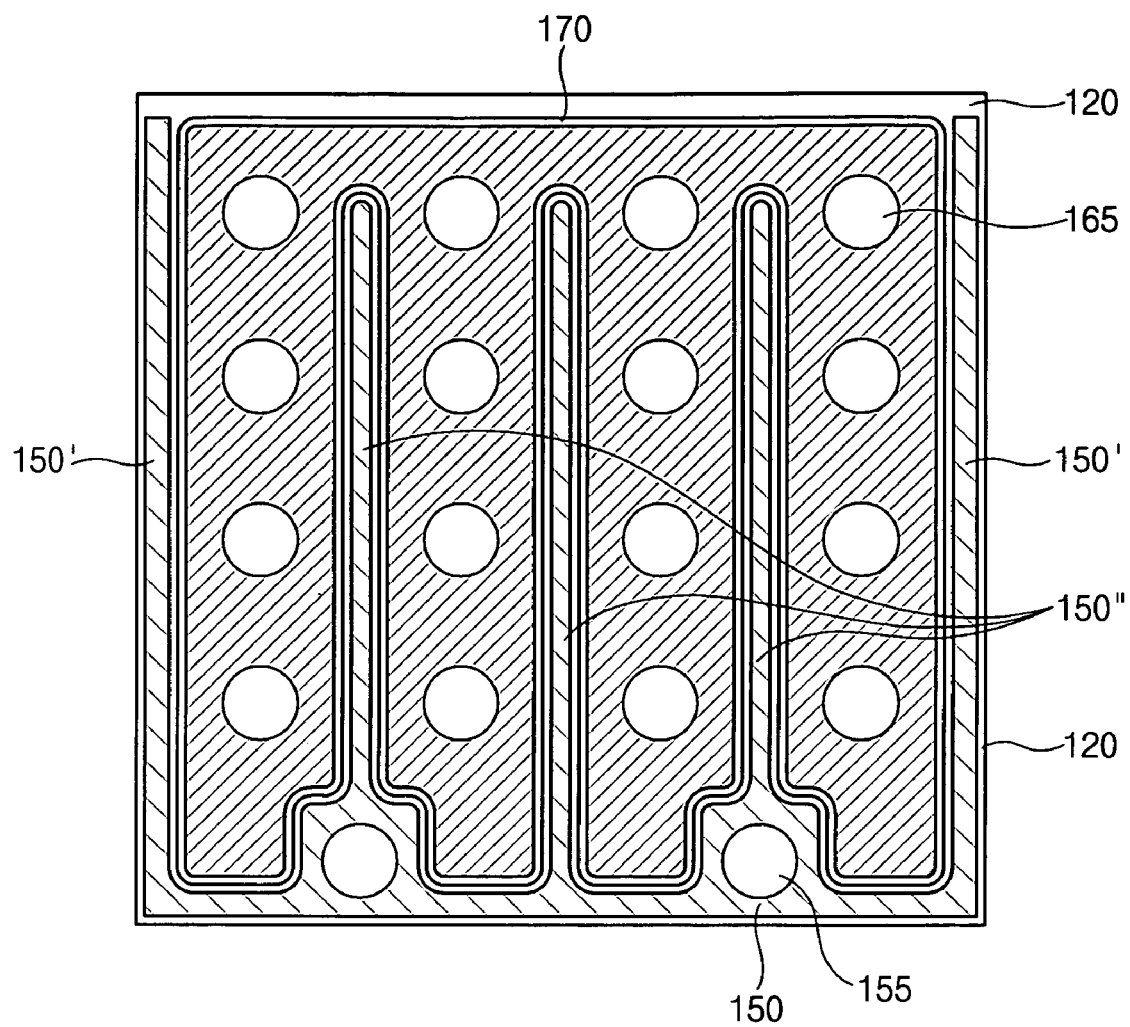
[FIG. 1]

[FIG. 2]
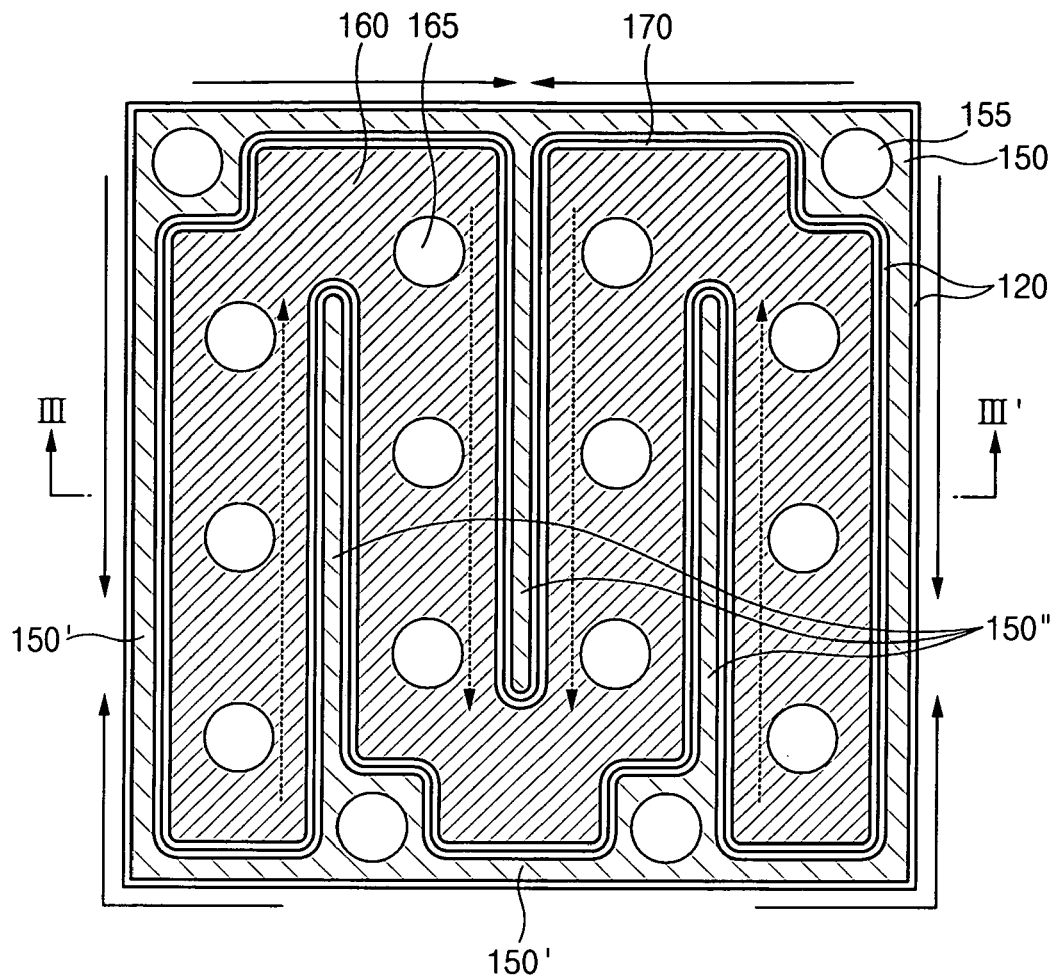
[FIG. 3]
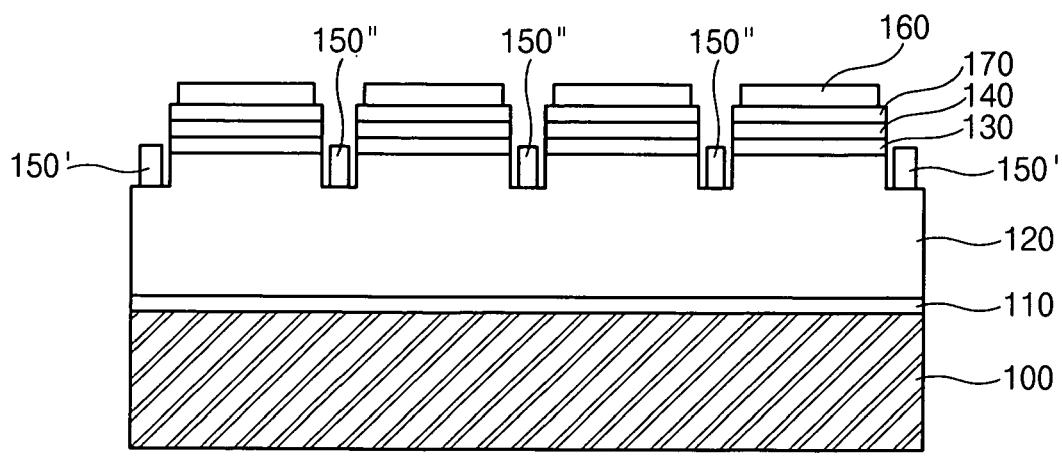

[FIG. 4]
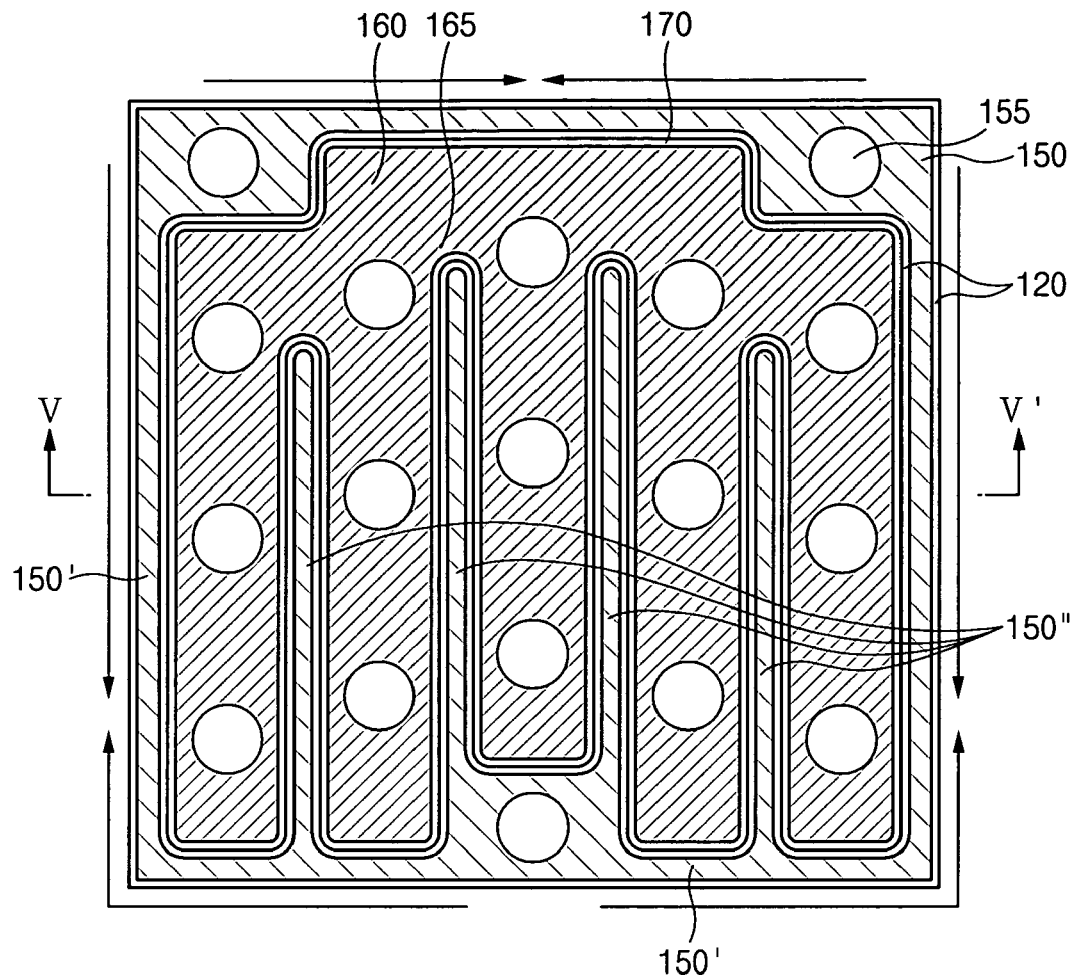
[FIG. 5]
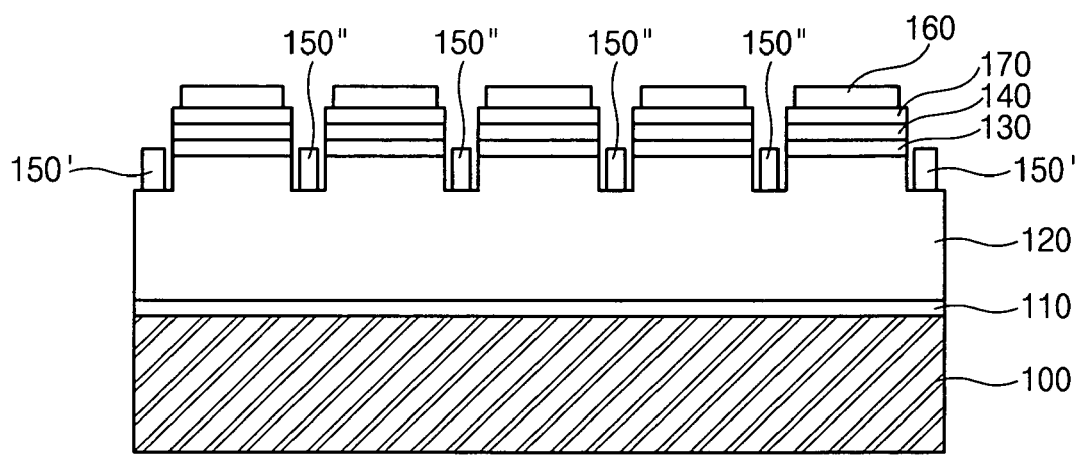

[FIG. 6]
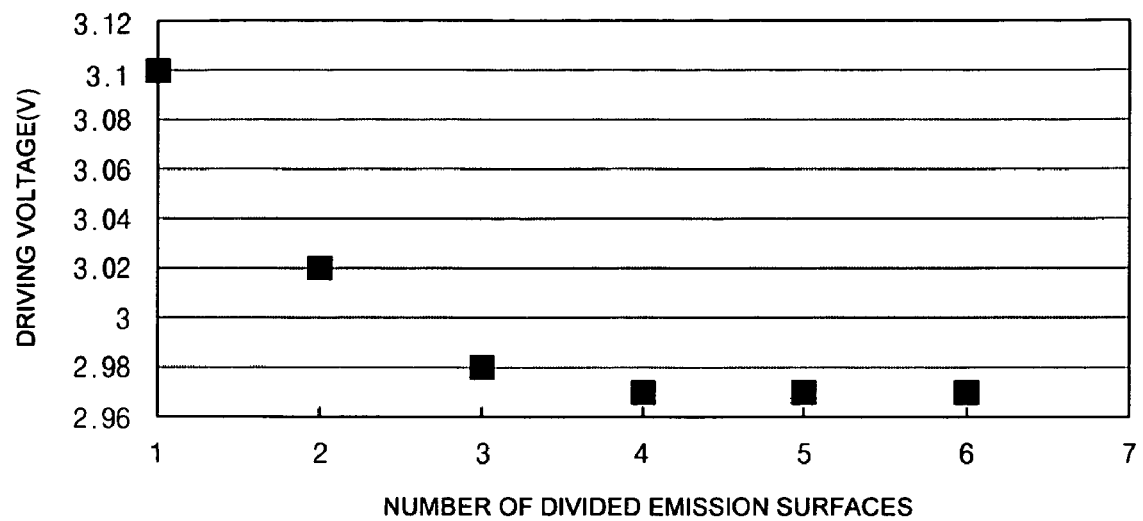

NITRIDE BASED SEMICONDUCTOR LIGHT EMITTING DIODE

CROSS-REFERENCE TO RELATED APPLICATIONS

This application claims the benefit of Korean Patent Application No. 2005-97604 filed with the Korean Industrial Property Office on Oct. 17, 2005, the disclosure of which is incorporated herein by reference.

BACKGROUND OF THE INVENTION

1. Field of the Invention

The present invention relates to a nitride based semiconductor light emitting diode (LED) that can be driven at a low driving voltage by improving the current spreading efficiency.

2. Description of the Related Art

Generally, nitride based semiconductors are group III-V semiconductor crystals having an empirical formula of $Al_XIn_YGa_{1-X-Y}N$ ($0 \leq X \leq 1$, $0 \leq Y \leq 1$, $0 \leq X+Y \leq 1$). The nitride based semiconductors are widely used as LEDs that emit short wavelength light (ranging from ultraviolet light to green light), especially a blue light.

The nitride based semiconductor LEDs are formed on an insulating substrate, such as a sapphire substrate or SiC substrate, which meets lattice matching condition for crystal growth. Two electrodes connected to a p-type nitride semiconductor layer and an n-type nitride semiconductor layer have a planar structure. That is, the two electrodes are arranged almost horizontally on an emission structure.

The nitride based semiconductor LEDs having the planar structure must have high brightness when they are to be used as a lighting source. In order to obtain the high brightness, large-sized nitride based semiconductor LEDs operating at a high current have been manufactured.

However, the nitride based semiconductor LEDs has such a vertical structure that two electrodes are respectively arranged on the top and bottom surfaces of the emission structure. Compared with the nitride based semiconductor LEDs having the vertical structure, the large-sized nitride based semiconductor LEDs having the planar structure have non-uniform current flow in an entire emission region. Thus, the effective area used for light emission is not so wide that the emission efficiency is low.

In addition, when the high current is applied to the large-sized nitride based semiconductor LED having the planar structure, the applied current is converted into heat, so that the temperature of the LED increases. Consequently, the driving voltage and characteristic of the LED is degraded.

Hereinafter, the problems of the large-sized nitride based semiconductor LED having the planar structure according to the related art will be described with reference to FIG. 1.

FIG. 1 is a plan view illustrating the arrangement of electrodes and an active region in a nitride based semiconductor LED according to the related art.

Referring to FIG. 1, the top surface of the LED includes an n-type nitride semiconductor layer 120, an active layer, and a p-type nitride semiconductor layer (not shown), which are sequentially formed on a substrate.

A p-electrode 160 and an n-electrode 150 are formed on the top surface of the LED. The p-electrode 160 and the n-electrode 150 are connected to the p-type nitride semiconductor layer (in some cases, a reflective electrode 170) and the n-type nitride semiconductor layer 120, respectively.

The n-electrode 150 includes two electrode pads 155 and a plurality of branch electrodes 150' and 150" extending from the electrode pads 155. The n-electrode 150 and the p-electrode 160 have a finger structure such that they are meshed with each other. At this point, the p-electrode 160 is divided by the branch electrodes 150' and 150" of the n-electrode 150, so that the emission area is divided.

That is, two n-type electrode pads 155 are formed on the n-electrode 150. When a high current is applied, the applied current is dispersed and the current spreading efficiency is improved by arranging the p-electrode 160 and the plurality of branch electrodes 150' and 150" extending from the n-electrode 150 in the finger shape. Consequently, failure of the device due to the application of the high current can be prevented.

In the large-sized nitride based semiconductor LED according to the related art, the high current is dispersed by two n-type electrode pads, thereby preventing the degradation in the driving voltage and characteristic. However, because the two n-type electrode pads are concentrated on one side of the LED, there is a limitation in improving the current spreading efficiency and reducing the driving voltage of the LED.

Therefore, there is an increasing demand for a technology that can improve the current spreading efficiency and reduce the driving voltage in the large-sized nitride based semiconductor LEDs.

SUMMARY OF THE INVENTION

An advantage of the present invention is that it provides a nitride semiconductor LED in which more than three n-type electrode pads are arranged to be uniformly distributed in a large area, so that an applied high current is effectively dispersed. Therefore, it is possible to improve the current spreading efficiency and to reduce a driving voltage.

Additional aspect and advantages of the present general inventive concept will be set forth in the description which follows and, in part, will be obvious from the description, or may be learned by practice of the general inventive concept.

According to one aspect of the present invention, a nitride based semiconductor LED includes: a substrate; an n-type nitride semiconductor layer formed on the substrate, the n-type nitride semiconductor layer having the top surface divided into a first region and a second region with a finger structure, so that the first region and the second region are meshed with each other; an active layer formed on the second region of the n-type nitride semiconductor layer; a p-type nitride semiconductor layer formed on the active layer; a reflective electrode formed on the p-type nitride semiconductor layer; a p-electrode formed on the reflective electrode; an n-electrode formed on the first region of the n-type nitride semiconductor layer; and a plurality of n-type electrode pads formed on the n-electrode, at least one of the n-type electrode pads being arranged adjacent to different sides of the n-electrode.

According to another aspect of the present invention, the second region is symmetrical with respect to the central portion of the substrate so as to emit a uniform light in an entire large-sized emission surface.

According to a further aspect of the present invention, at least three n-type electrode pads are formed. The n-type electrode pad is arranged to cross n-type electrode pad formed on the different surface. The n-type electrode pad has a width of 500 μm or less so as to minimize the reduction of the emission surface.

According to a still further aspect of the present invention, the n-type electrode includes: a first n-type branch electrode formed on the first region along the outermost side of the n-type nitride semiconductor layer; and a second n-type branch electrode formed on the first region having a finger structure within the n-type nitride semiconductor layer.

According to a still further aspect of the present invention, the plurality of n-type electrode pads are electrically connected to one another through the first n-type branch electrode of the n-electrode. The first n-type branch electrode has a width greater by 25 than a width of the second n-type branch electrode so as to prevent the resistance from being increased by the collision of the currents applied from the n-type electrode pads.

According to a still further aspect of the present invention, the second region has an area greater than that of the first region so as to maximize the emission surface.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view illustrating the arrangement of electrodes and an active region in a nitride based semiconductor LED according to the related art;

FIG. 2 is a plan view illustrating the arrangement of electrodes and an active region in a nitride based semiconductor LED according to a first embodiment of the present invention;

FIG. 3 is a sectional view taken along line III-III' of FIG. 2;

FIG. 4 is a plan view illustrating the arrangement of electrodes and an active region in a nitride based semiconductor LED according to a second embodiment of the present invention;

FIG. 5 is a sectional view taken along line V-V' of FIG. 4; and

FIG. 6 illustrates a simulation result of the variation of a driving voltage with respect to the divided emission areas in the nitride based semiconductor LED according to the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, nitride based semiconductor LEDs according to the embodiments of the present invention will be described in detail with reference to the accompanying drawings.

Embodiment 1

A large-sized nitride based semiconductor LED having a planar structure according to a first embodiment of the present invention will be described in detail with reference to FIGS. 2 and 3.

FIG. 2 is a plan view illustrating the arrangement of electrodes and an active region in the nitride based semiconductor LED according to the first embodiment of the present invention, and FIG. 2 is a sectional view taken along line III-III' of FIG. 2.

Referring to FIGS. 2 and 3, a buffer layer 110 and an n-type nitride semiconductor layer 120 are sequentially formed on a light transmissive substrate 100. The n-type nitride semiconductor layer 120 is divided into a first region and a second region. The first region and the second region have a finger structure such that they are meshed with each other.

The second region defines an emission surface. Thus, it is preferable that an area of the second region is greater than that of the first region so as to improve the brightness characteristic of the LED. That is, it is preferable that the area of the second region is more than 50% of the entire area of the n-type nitride semiconductor layer 120. In addition, it is preferable that the second region is symmetrical with respect to the center portion of the substrate 100 so as to emit uniform light over a large-sized emission surface.

The substrate 100 is a substrate suitable for growing a nitride semiconductor single crystal. Preferably, the substrate 100 is formed of transparent materials, including sapphire. In addition, the substrate 100 may be formed of zinc oxide (ZnO), gallium nitride (GaN), silicon carbide (SiC), and aluminum nitride (AlN).

The buffer layer 110 is a layer for improving the lattice matching with the sapphire substrate 110 before the n-type nitride semiconductor layer 120 is grown on the substrate 100. Generally, the buffer layer 100 is formed of AlN/GaN.

The n-type nitride semiconductor layer 120 may be formed of semiconductor materials having an empirical formula of $In_XAl_YGa_{1-X-Y}N$ ($0 \leq X$, $0 \leq Y$, $X+Y \leq 1$). More specifically, the n-type nitride semiconductor layer 120 may be formed of GaN layer or GaN/AlGaN layer doped with n-type impurities. Examples of the n-type impurities include Si, Ge, and Sn. Preferably, Si is widely used as the n-type impurities.

An active layer 130 and a p-type nitride semiconductor layer 140 are sequentially formed on the second region of the n-type nitride semiconductor layer 120, thereby forming an emission structure.

The active layer 130 may be formed of InGaN/GaN layer having a multi-quantum well structure.

The p-type nitride semiconductor layer 140 may be formed of semiconductor material having an empirical formula of $In_XAl_YGa_{1-X-Y}N$ ($0 \leq X$, $0 \leq Y$, $X+Y \leq 1$). More specifically, the p-type nitride semiconductor layer 140 may be formed of GaN layer or GaN/AlGaN layer doped with p-type impurities. Examples of the p-type impurities include Mg, Zn, and Be. Preferably, Mg is widely used as the p-type impurities.

An n-electrode 150 is formed on the first region of the n-type nitride semiconductor layer 120. The n-electrode 150 includes a plurality of branch electrodes 150' and 150" extending therefrom so as to efficiently disperse an applied high current. More specifically, the n-electrode 150 includes the first n-type branch electrode 150' formed on the first region to uniformly surround the outermost side of the n-type nitride semiconductor layer 120, and the second n-type branch electrode 150" formed on the first region having a finger structure within the n-type nitride semiconductor layer 120, thus minimizing the local current concentration phenomenon.

A plurality of n-type electrode pads 155 are formed on the n-electrode 150. At least one or more n-type electrode pads 155 are arranged adjacent to different sides of the n-electrode 150 so as to supply a uniform current to any locations of the emission surface. In addition, these n-type electrode pads 155 are arranged to cross one another.

In this embodiment, as illustrated in FIG. 2, four n-type electrode pads 155 are formed at different sides and arranged to cross one another. At this point, it is preferable that the n-type electrode pad 155 has a width of less than 500 μm so as to minimize the reduction of the emission surface.

Further, because the n-type electrode pads 155 are all electrically connected through the first n-type branch electrode 150' of the n-electrode 150, the current can be more efficiently diffused in the large-sized nitride based semiconductor LED.

In this case, the current spreading efficiency can be improved, but the resistance will increase because the currents (indicated by a solid line of FIG. 2) applied from the n-type electrode pads 155 collide at the first n-type branch electrode 150'.

To solve this problem, the first n-type branch electrode 150' is formed to have a width greater by 25% than a width of the second n-type branch electrode 150". Therefore, it is possible to prevent the resistance from being increased when the currents applied from the n-type electrode pads 155 collide at the first n-type branch electrode 150'.

A reflective electrode 170 is formed on the p-type nitride semiconductor layer 140.

A p-electrode 160 is formed on the reflective electrode 170. In this embodiment, the p-electrode 160 is divided into four sections by the first and second n-type branch electrodes 150' and 150" of the n-electrode 150, and are all electrically connected to one another. Therefore, the current spreading characteristic can be more improved and the driving voltage can be decreased.

Moreover, a plurality of p-type electrode pads 165 are formed on the p-electrode 160.

Embodiment 2

A large-sized nitride based semiconductor LED having a planar structure according to a second embodiment of the present invention will be described in detail with reference to FIGS. 4 and 5. The same parts as the first embodiment of the preset invention will be omitted for conciseness.

FIG. 4 is a plan view illustrating the arrangement of electrodes and an active region in the nitride based semiconductor LED according to the second embodiment of the present invention, and FIG. 5 is a sectional view taken along line V-V' of FIG. 5.

Referring to FIGS. 4 and 5, the nitride based semiconductor LED according to the second embodiment of the present invention is almost identical to the nitride based semiconductor LED according to the first embodiment of the present invention, except that a p-electrode 160 is divided into five sections by first and second n-type branch electrodes 150' and 150" of an n-electrode 150.

In the nitride based semiconductor LED according to the first embodiment of the present invention, four n-type electrode pads are provided. On the other hand, in the nitride based semiconductor LED according to the second embodiment of the present invention, three n-type electrode pads are provided. In addition, the n-type electrode pads 155 are formed at almost identical locations so as to maximize the emission surface. This does not greatly influence the characteristics of the LED.

Like the first embodiment of the present invention, the nitride based semiconductor LED according to the second embodiment of the present invention includes the plurality of n-type electrode pads 155 and the p-electrode 160, which is divided into a plurality of sections and all electrically connected to one another. Therefore, the second embodiment of the present invention can obtain the same operation and effect as those of the first embodiment of the present invention.

In this embodiment, the p-electrode 160 is divided by one more than the first embodiment of the present invention. Thus, as illustrated in FIG. 6, the second embodiment of the present invention can obtain a lower driving voltage compared with the first embodiment of the present invention.

FIG. 6 illustrates a simulation result of the variation of a driving voltage with respect to the divided emission areas in the nitride based semiconductor LED according to the present invention.

In the first and second embodiments of the present invention, the n-type electrode pad and the p-type electrode pad are indicated by reference numerals 155 and 165, respectively. However, the n-type electrode pad and the p-type electrode pad do not really exist, but they represent the regions that come in contact with bump balls in the electrical connection through sub mounts and bump balls.

As described above, the p-electrode is divided by the branch electrodes of the n-electrode and the divided regions are all electrically connected to one another. Therefore, the large-sized emission surface can be driven at a low driving voltage.

In addition, the plurality of n-type electrode pads are provided on the different surfaces, so that the current is uniformly dispersed over the entire emission surface. Therefore, the uniform light emission is achieved over the entire emission surface, thereby improving the brightness of the LED.

Consequently, the driving voltage can be decreased and the brightness can be improved, thereby improving the characteristic and reliability of the LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride based semiconductor light emitting diode (LED) comprising:
    a substrate;
    an n-type nitride semiconductor layer formed on the substrate, the n-type nitride semiconductor layer having the top surface divided into a first region and a second region with a finger structure, so that the first region and the second region are meshed with each other;
    an active layer formed on the second region of the n-type nitride semiconductor layer;
    a p-type nitride semiconductor layer formed on the active layer;
    a reflective electrode formed on the p-type nitride semiconductor layer;
    a p-electrode formed on the reflective electrode;
    an n-electrode, having a square outline, formed on the first region of the n-type nitride semiconductor layer; and
    only four n-type electrode pads which are formed adjacent to the edge of the n-electrode thereon,
    wherein the second region is not cut off by the first region and is a continuous surface,
    wherein two of the n-type electrode pads are located on two corners of a first side of the n-type semiconductor layer, and the other two n-type electrode pads are symmetrically located on a second side, which is opposite the first side, and are separated by a distance smaller than the distance between the two of the n-type electrode pads on the corners of the first side, and
    at the two corners of the second side facing the two of the n-type electrode pads located on the first side, and at the point of the first side facing the other two n-type pads located on the second side, no further n-electrode pads are located.

2. The nitride based semiconductor LED according to claim 1,
wherein the second region is symmetrical with respect to the central portion of the substrate.

3. The nitride based semiconductor LED according to claim 1,
wherein each of the n-type electrode pads has a width of 500 µm or less.

4. The nitride based semiconductor LED according to claim 1,
wherein the n-type electrode includes:
a first n-type branch electrode formed on the first region along the outermost side of the n-type nitride semiconductor layer; and
a second n-type branch electrode formed on the first region having a finger structure within the n-type nitride semiconductor layer.

5. The nitride based semiconductor LED according to claim 4,
wherein the first n-type branch electrode has a width greater by 25% than a width of the second n-type branch electrode.

6. The nitride based semiconductor LED according to claim 4,
wherein the plurality of n-type electrode pads are electrically connected to one another through the first n-type branch electrode of the n-electrode.

7. The nitride based semiconductor LED according to claim 1,
wherein the second region has an area greater than that of the first region.

8. The nitride based semiconductor LED according to claim 1,
wherein the second region has a zigzag shape.

* * * * *